(12) United States Patent
Lerke

(10) Patent No.: US 8,190,189 B2
(45) Date of Patent: May 29, 2012

(54) POWER MANAGEMENT IN LOW POWER WIRELESS LINK

(75) Inventor: Peter Dam Lerke, Smørum (DK)

(73) Assignee: Oticon A/S, Smorum (DK)

( * ) Notice: Subject to any disclaimer, the term of this patent is extended or adjusted under 35 U.S.C. 154(b) by 187 days.

(21) Appl. No.: 12/690,702

(22) Filed: Jan. 20, 2010

(65) Prior Publication Data
US 2010/0184383 A1 Jul. 22, 2010

(30) Foreign Application Priority Data

Jan. 21, 2009 (EP) .................................. 09150980

(51) Int. Cl.
*H04B 7/00* (2006.01)
(52) U.S. Cl. .................... 455/522; 455/13.4; 455/127.1; 455/41.2; 381/23.1; 381/79; 381/309
(58) Field of Classification Search .................. 455/66.1, 455/67.11, 41.2, 127.1, 522, 572, 573, 343.1, 455/343.6, 127.4, 127.5; 340/7.38, 6, 505, 340/825.54; 381/315, 68.2, 68.6, 94.1, 312, 381/313, 92, 94.2, 94.3, 314
See application file for complete search history.

(56) References Cited

U.S. PATENT DOCUMENTS

| | | | |
|---|---|---|---|
| 5,956,330 A | 9/1999 | Kerns | |
| 7,313,378 B2 | 12/2007 | Terry | |
| 7,577,266 B2 * | 8/2009 | Feng et al. | 381/313 |
| 7,596,237 B1 * | 9/2009 | Constantin | 381/314 |
| 7,613,309 B2 * | 11/2009 | Jones et al. | 381/94.1 |
| 2002/0137535 A1 | 9/2002 | Hunzinger | |

(Continued)

FOREIGN PATENT DOCUMENTS
EP 1 107 472 A2 6/2001
(Continued)

OTHER PUBLICATIONS

"cdma2000R High Rate Packet Data Air Interface Specification", TIA-856-A, (Revision of TIA/EIA/IS-856), TIA Specifications, Apr. 2004, XP017004836, pp. 14-6 through 14-10.

(Continued)

*Primary Examiner* — Sujatha Sharma
(74) *Attorney, Agent, or Firm* — Birch, Stewart, Kolasch & Birch, LLP

(57) ABSTRACT

The invention relates to a communication system comprising a first and a second communication device, each comprising transmit and receive units for establishing a wireless link between the devices, wherein the first device is a portable listening device. The invention further relates to a method, a data processing system and a medium. The object of the present invention is to control power consumption in a short range wireless link. The problem is solved in that at least the first communication device comprises a control unit for dynamically adjusting the transmit power of its transmit unit based on a measure of the quality of the link, wherein the system is adapted to use the dynamic transmit power regulation to implement a partial power-down mode of the system, when the two communication devices are expected NOT to be in a normal use, wherein the partial power-down mode at least comprises a power-down of the components related to the wireless link. This has the advantage of enabling an adaptation of the power consumption to the current needs. The invention may e.g. be used for wireless communication between (portable) low power devices, e.g. between a pair of hearing instruments.

23 Claims, 7 Drawing Sheets

U.S. PATENT DOCUMENTS

| | | |
|---|---|---|
| 2005/0110700 A1 | 5/2005 | Terry |
| 2005/0276248 A1 | 12/2005 | Butala et al. |
| 2007/0097962 A1 | 5/2007 | Yoon et al. |
| 2008/0226107 A1 | 9/2008 | Boguslavskij et al. |
| 2011/0129106 A1* | 6/2011 | Hasler et al. ............... 381/315 |

FOREIGN PATENT DOCUMENTS

| | | |
|---|---|---|
| EP | 1715723 | * 10/2005 |
| EP | 1 777 644 A1 | 4/2007 |
| EP | 1 860 914 A1 | 11/2007 |
| GB | 2 307 623 A | 5/1997 |
| WO | WO-93/10609 A1 | 5/1993 |
| WO | WO-01/80795 A1 | 11/2001 |
| WO | WO-2005/053179 A1 | 6/2005 |
| WO | WO-2005/055654 A1 | 6/2005 |
| WO | WO-2008/089784 A1 | 7/2008 |

OTHER PUBLICATIONS

Benkic et al., "Using RSSI value for distance estimation in Wireless sensor networks based on ZigBee", Systems, Signals and Image Processing, 2008, IWSSIP 2008, 15th International Conference on, IEEE, Piscataway, NJ, USA, Jun. 25, 2008, pp. 303-306, XP031310445.

Cai et al., "AGC and IF amplifier circuits design", Wireless Communication Technology, 2003 IEEE Topical Conference on Honolulu, HI, USA, Oct. 15-17, 2003, Piscataway, NJ, USA, IEEE, Oct. 15, 2003, pp. 42-46, XP010717119.

* cited by examiner

| Power setting | Level | Comments |
|---|---|---|
| PL0 | 0dB | Ensure always binaural connection, when in *Typical zone* |
| PL1 | -3dB | Binaural communication |
| PL2 | -6dB | Binaural communication |
| PL3 | -15dB | Binaural communication |
| PL4 | -20-25dB | PL(VC), *VeryClose zone*, extreme low power, |

FIG. 3a

| Power setting | Level [dB] | Average AGC-setting-algorithm |
|---|---|---|
| PL0 | 0 | IF AGC < AGC0(LOW) => PL=PL1, IF AGC > AGC0(HIGH) => PWD |
| PL1 | -3 | IF AGC < AGC1(LOW) => PL=PL2, IF AGC > AGC1(HIGH) => PL=PL0 |
| PL2 | -6 | IF AGC < AGC2(LOW) => PL=PL3, IF AGC > AGC2(HIGH) => PL=PL1 |
| PL3 | -9 | IF AGC < AGC3(LOW) => PL=PL4, IF AGC > AGC3(HIGH) => PL=PL2 |
| PL4 | -12 | IF AGC < AGC4(LOW) => PL=PL5, IF AGC > AGC4(HIGH) => PL=PL3 |
| PL5 | -24 | *VeryClose zone*, PL(VC), IF LINK OK => PWD, IF LINK NOK => PL=PL0 |

FIG. 3b

| Power setting | Level [dB] | CRC-error-algorithm |
|---|---|---|
| PL0 | 0 | IF ER ≥ ERhigh => PL=PL0, IF ER ≤ ERlow => PL=PL1, IF CRC > Ncrit => PL=PL5 |
| PL1 | -3 | IF ER ≥ ERhigh => PL=PL0, IF ER ≤ ERlow => PL=PL2, IF CRC > Ncrit => PL=PL0 (CRC=0) |
| PL2 | -6 | IF ER ≥ ERhigh => PL=PL1, IF ER ≤ ERlow => PL=PL3, IF CRC > Ncrit => PL=PL0 (CRC=0) |
| PL3 | -9 | IF ER ≥ ERhigh => PL=PL2, IF ER ≤ ERlow => PL=PL4, IF CRC > Ncrit => PL=PL0 (CRC=0) |
| PL4 | -12 | IF ER ≥ ERhigh => PL=PL3, IF ER ≤ ERlow => PL=PL4, IF CRC > Ncrit => PL=PL0 (CRC=0) |
| PL5 | -24 | *VeryClose zone*, PL(VC), IF LINK OK => PWD, IF LINK NOK => PL=PL0 |

FIG. 3c

| Mode | CRC | AGC | FS |
|---|---|---|---|
| Typical | N | N | N |
| VeryFar | H | H | L |
| VeryClose | H | L | H |
FIG. 3d
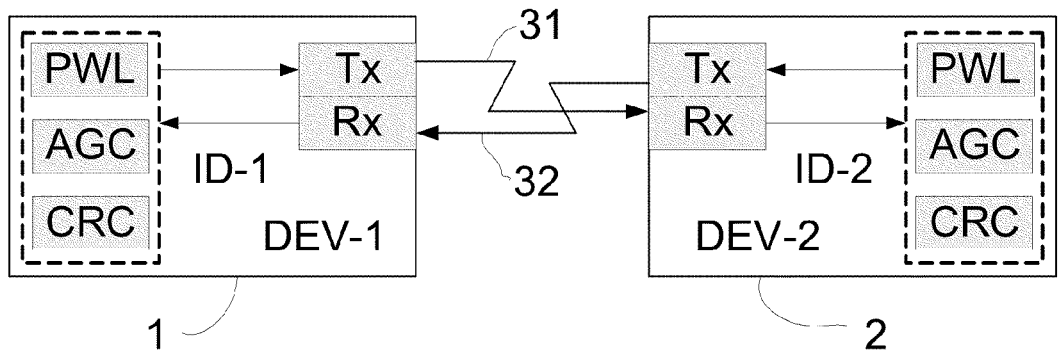
FIG. 4
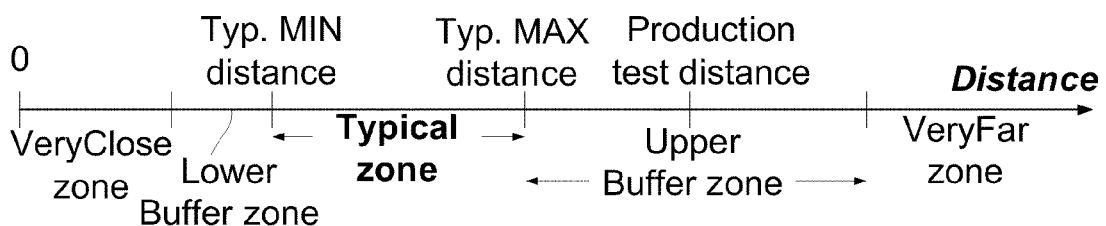
FIG. 5

POWER MANAGEMENT IN LOW POWER WIRELESS LINK

TECHNICAL FIELD

The present invention relates to low power wireless communication, and especially to power management, including power regulation. The invention relates specifically to a communication system comprising a first and a second communication device, each comprising transmit and receive units for establishing a wireless link between the devices.

The invention furthermore relates to a method of controlling power consumption in a wireless link between two communication devices.

The invention furthermore relates to a data processing system and to a tangible computer-readable medium.

The invention may e.g. be useful in applications such as wireless communication between (portable) low power devices, e.g. between a pair of hearing instruments.

BACKGROUND ART

First generation wireless link systems for portable listening devices, such as hearing aids, have typically been based on fixed transmitted power between the devices. The transmitter current is, e.g. in the production phase, (conservatively) aligned to the minimum current with which the system always can achieve binaural communication, taking into account component tolerances, different operational distances between devices because of variation in head sizes, etc. The overhead in current in a particular setup represents a waste of power for those devices.

EP 1 860 914 A1 describes a method of operating a hearing assistance system comprising establishing a wireless link between a hearing device and a remote device for transmitting signals from the remote device to the hearing device, and operating the system in a base mode and an interference mode, and detecting whether a source of radio frequency signals interfering with the wireless link is present in the vicinity of the hearing device, the interfering source having a transmission power changing according to a predictable scheme between low power regimes and high power regimes. In the interference mode, the transmission of the signals from the remote device to the hearing device is synchronized to the detected power scheme of the interfering signals in such a manner that the signals are transmitted only during the low power regimes.

US 2008/0226107 A1 describes a transmission method and a corresponding system for inductive transmission, in which the receiver returns an item of quality information relating to the received signal back to the transmitter. The transmission power of the transmitter is then dynamically varied as a function of the item of quality information.

DISCLOSURE OF INVENTION

An object of the present invention is to control power consumption in a short range wireless link.

A Communication System:

An object of the invention is achieved by a communication system comprising a first and a second communication device, each comprising transmit and receive units for establishing a wireless link between the devices. The system is adapted to provide that at least the first communication device comprises a control unit for dynamically adjusting the transmit power of its transmit unit based on a measure of the quality of the link.

In a first aspect, a communication system is provided, the system comprising a first and a second communication device, each comprising transmit and receive units for establishing a wireless link between the devices, wherein at least the first communication device is a portable listening device and comprises a control unit for dynamically adjusting the transmit power of its transmit unit based on a measure of the quality of the link, wherein the system is adapted to use the dynamic transmit power regulation to implement a partial power-down mode of the system, when the two communication devices are expected NOT to be in a normal use, wherein the partial power-down mode at least comprises a power-down of the components related to the wireless link.

This has the advantage of enabling an adaptation of the power consumption to the current needs. In an embodiment, a minimization of power consumption of the link is enabled.

The term 'a measure of the quality of the link' is in the present context also termed 'link quality' and abbreviated 'LQ'. It is understood that an increase in link quality means a better and more reliable link, whereas a decrease in link quality means a worse and less reliable link.

Typically, 'a power-down of a component' is taken to mean that the electrical energy to said component is switched off. In an embodiment, 'a power-down of the components related to the wireless link' is taken to mean that the electrical energy to the components related to the wireless link (e.g. transceiver circuitry) is switched off In an embodiment, both the first and second device comprise a control unit for dynamically adjusting the transmit power of its respective transmit unit based on a measure of the quality of the link. In an embodiment, the first and second communication devices are functionally identical, at least regarding the functionality of the wireless link. This means that the units and properties of the first, transmitting and the second, receiving devices, respectively, as outlined above and in the following, are identically mirrored in the second and first devices, respectively, for use when the second device is transmitting to the first device. In an embodiment, the first and second communication devices are functionally identical apart from possible minor differences introduced for identification purposes, such as a left and a right hearing instrument of a binaural fitting. In the following, reference is typically made to the transmitting and receiving devices, without specifically differentiating between the 'first' and 'second' device.

In an embodiment, at least one of the communication devices has a local energy source, e.g. in the form of a battery. In a first aspect, at least one of the communication devices is a portable device, e.g. a low power device comprising an energy source, which—without being exchanged or recharged—is of limited duration (the limited duration being e.g. of the order of hours or days, such duration being limited compared to the expected life time of the device). In an embodiment, the maximum supply voltage of the energy source is than 5 V, such as less than 4 V, such as less than 3 V, such as less than 1.5 V. In an embodiment, the typical duration of the energy source of the communications device is less than 2 weeks, such as less than 1 week, such as less than 2 days, such as less than 1 day, such as less than 8 hours.

In an embodiment, at least one of the communication devices comprises a mobile telephone. In an embodiment, both communication devices are portable devices. In a first aspect, at least one of the communication devices comprises a listening device such as a hearing instrument. In an embodiment, at least one of the communication devices comprises an audio selection device (audio gateway) for receiving a number of audio signals and for selecting and transmitting one audio signal to a listening device, such as a hearing instrument. In an embodiment, the first and second communication devices each comprise a listening device, such as a hearing instrument. In an embodiment, one of the communication devices comprises a charging device for charging a rechargeable battery e.g. of the other communication device of a communication system according to the invention.

In general, the wireless link can be of any type used under power constraints such as in a portable (typically battery driven) communication device. In an embodiment, the wireless link is a link based on near-field communication, e.g. an inductive link based on an inductive coupling between antenna coils of the first and second communication devices. In another embodiment, the wireless link is based on far-field, electromagnetic radiation. In an embodiment, the communication via the wireless link is arranged according to a specific modulation scheme, e.g. an analogue modulation scheme, such as FM (frequency modulation) or AM (amplitude modulation), or a digital modulation scheme, such as FSK (frequency shift keying), PSK (phase shift keying) or FH-SS (frequency hopping spread spectrum).

In an embodiment, the measure of the quality of the link is extracted in the receiving communication device based on the signal received from the transmitting communication device. Alternatively, the measure of the quality of the link is extracted in the (first) transmitting communication device based on a signal received from the (second) receiving communication device.

In an embodiment, a received (possibly demodulated) signal comprises a number of time frames, each time frame comprising a predefined number N of digital time samples $x_n$ (n=1, 2, ..., N), corresponding to a frame length in time of $L=N/f_s$, where $f_s$ is a sampling frequency of an analog to digital conversion unit. In an embodiment, a time frame has a length in time of at least 8 ms, such as at least 24 ms, such as at least 50 ms, such as at least 80 ms. In an embodiment, the sampling frequency of an analog to digital conversion unit is larger than 1 kHz, such as larger than 4 kHz, such as larger than 8 kHz, such as larger than 16 kHz. In an embodiment, the sampling frequency is in the range between 1 kHz and 20 kHz.

In an embodiment, only control signals, e.g. concerning settings of an individual device defining its current state, are transmitted via the wireless link. In an embodiment, full or partial audio signals (e.g. certain frequency ranges of the audio signal), possibly including control signals, are transmitted via the wireless link.

In an embodiment, the measure of the quality of the link is extracted in a link quality evaluation unit in the receiving communication device based on the signal received from the transmitting communication device. Alternatively, the measure of the quality of the link may be extracted in a link quality evaluation unit in the transmitting communication device itself based on a signal received from the other (receiving) communication device.

In an embodiment, the communication system is adapted to transmit and receive signals according to a digital protocol, wherein the transmitted and received signals comprise data arranged in packets according to said protocol.

In an embodiment, the receiving communication device is adapted to transmit the measure of the quality of the link to the transmitting communication device and the transmitting communication device is adapted to receive the measure of the quality of the link and to adjust the transmit power based on the received measure of the quality of the link.

In an embodiment, the actions of regulating the power level of the transmitter of the transmitting device is performed after a delay corresponding to the action in question, the delay possibly depending on the current power level, and/or the intended future power level, and/or a value and/or a rate of change of the link quality measure. A fast rate of change and/or a relatively large intended change in power level (e.g. more than one power level step) can e.g. result in a low or no delay in the consequent regulation.

In an embodiment, the link quality measure is averaged over time. By adjusting the time over which the link quality is averaged, the speed of reaction of the power level adjustment can be influenced, an increased averaging time resulting in a reduced speed of reaction and vice versa.

In an embodiment, the communication system is adapted to be in an operational state (Normal mode) when the first and second devices are within a Typical range of distances from each other (e.g. 0.10 to 0.40 m), the Typical zone. In an embodiment, the system is adapted to detect whether a transmitting device is located in a VeryClose zone (e.g. 0 to 0.10 m), where the two devices are closer to each other than in the Typical zone. In an embodiment, the system is adapted to detect whether a transmitting device is located in a VeryFar zone (e.g. >0.40 m), where the two devices are farther away from each other than in the Typical zone.

The system is adapted to provide a number of normal transmit power levels (between a minimum normal voltage and a maximum normal voltage) to be used in a Normal mode of operation. The method further provides an extremely low transmit power level (smaller than the minimum normal transmit power level) adapted to allow a link between the two devices to be established when the two devices are in close proximity of each other, e.g. in a VeryClose zone relative to each other (e.g. within a distance of less than 5 cm from each other).

In an embodiment, a transmitting device is in an operational state (and thus in a Normal mode of operation, the two devices of the communication system thus operating in a Typical zone) when a link having a predefined link quality can be established from the transmitting device to the receiving device using a normal transmit power level.

In a first aspect, the system is adapted to use the dynamic power regulation to implement a partial power down or sleep mode of the system, when the two communications devices are expected NOT to be in a normal use, either because the two communication devices are placed very close to each other (e.g. in a charging station for charging rechargeable batteries for at least one of the devices, or in a travel box or a box for keeping devices over night), cf. VeryClose zone in FIG. 5, or because the two communication devices are placed very far from each other (e.g. by a mistake), cf. VeryFar zone in FIG. 5.

The devices can therefore be adapted to enter a partial power down mode for saving power, when located in one of these zones. In an embodiment, each communication device comprises a manually operable on/off switch, capable of overriding a system-induced power down (or simply to power the device up (switch the device on) or power it down (switch the device off)). In an embodiment, the dynamic range of the power level regulation is adapted to be large enough (e.g. larger than 10 dB, such as larger than 20 dB, such as larger than 30 dB) to discover and react to a saturation in the transmission, when the two devices are located very close to each other (i.e. closer than a range indicating a normal distance of operation (cf. 'Typical zone' in FIG. 5, possibly including 'Lower' and 'Upper Buffer zones'), e.g. less than 10 cm from each other, or less than 5 cm from each other, or less than 2 cm from each other), to ensure that a high quality link can be maintained (with an extremely low power level, e.g. <−20 dB of (i.e. >20 dB lower than) the maximum power level) also at very short distances between the devices. In an embodiment, it is concluded that the two devices are very far from each other (i.e. farther from each other than a range indicating a normal distance of operation, e.g. more than 30-50 cm from each other), if a wireless connection cannot be established between the two devices (even when a maximum transmit power level is applied). A detection of the fact that 'no wireless link can be established' can e.g. be based on an extremely large error count in the received signal even at the highest power level (e.g. after having detected that a link cannot be established at an extremely low power level).

In a partial power down mode, the system is adapted to wake-up at predefined points in time, e.g. regularly, e.g. every 1 minute or every 5 minutes or every 15 minutes, or with increasing distance in time, e.g. $t_{n+1}=(n+1)t_n$ after the initial power down at $t_0$. If $t_1=1$ minute, $t_2=2$ minutes, $t_3=6$ minutes, $t_4=24$ minutes, etc. In an embodiment, $t_1=10$ s. In an embodiment, such algorithm is combined with a 'reset' of the algorithm (starting from n=0) when n=5-20 or after a specific time, e.g. every 2 hours.

In an embodiment, the wake-up procedure from a partial power-down (sleep mode) is different depending upon whether the partial power-down mode has been entered from a VeryClose mode of a VeryFar mode. Preferably a wake-up procedure is implemented in the first and the second devices of the system. In the following, the procedure is anticipated to be initiated from a transmitting device (which in practice can be any of the first and second devices of the system, depending on the situation).

Preferably, each of the first and second devices comprises a memory, e.g. a non-volatile memory. In an embodiment, each device is adapted to detect which mode the system (and thus the device in question) is currently in and to store its previous and current mode in the memory. Alternatively, the memory can be volatile, if the volatile memory is able to hold the stored information during a partial power-down of the system or device in question.

An embodiment of a wake-up algorithm is outlined in the following. In an embodiment, the wake-up procedure is adapted to identify whether the partial power-down or sleep mode should continue (which is the case, if the link can be established with an extremely low power level, if the partial power-down or sleep mode has been entered from a VeryClose mode, indicating that the very close proximity of the two devices still persists) or whether the device should start normal communication activities (if—again assuming that the partial power-down or sleep mode has been entered from a VeryClose mode—e.g. NO link can be established with an extremely low power level, e.g. resulting in normal power-up, e.g. where the transmitter is set to maximum power level or gradually increased to higher and higher power levels 'in search for an appropriate level'). In an embodiment, the wake-up procedure comprises that—in case the partial power-down or sleep mode has been entered from a VeryFar mode—the device is adapted to check whether a link to the other device can be established with an extremely low power level. If yes, it is concluded that the device has been brought into a VeryClose zone and now is in a VeryClose mode, and the partial power-down mode is maintained. If no, the device is adapted to check whether a link to the other device can be established with maximum power level. If yes, it is concluded that the device has been brought into a Typical zone of operation and now is in a Normal mode, which is maintained. If no, it is concluded that the device is still in a VeryFar mode, and the device goes back into partial power-down or sleep mode.

The order of checking whether a link can be established at an extremely low power level or with a maximum power level may e.g. be reversed.

In a first aspect, the partial power down mode at least comprises a power-down of the components related to the wireless link (e.g. the transceiver). In an embodiment, ONLY the components related to the wireless link are powered down during a partial power-down. In an embodiment, the partial power down mode comprises a power-down of other components of the communication device related to the primary functionality of the device, e.g. main power consuming components (e.g. amplifier(s), signal processor(s), microphone(s), display(s), etc.). In an embodiment, 'partial power down' is taken to mean that the power consumption of the functional entity of the device is reduced substantially compared to a normally operating state of the device, such as to 10% of normal, such as to 5% of normal, such as to 1% of normal.

In an embodiment, the system is adapted to provide that a device in the VeryFar zone issues an alarm signal (e.g. an acoustical and/or an optical alarm signal) to make a user aware of its current location (to ease its finding in case of an accidental re-location). In an embodiment, the system is adapted to issue an alarm signal (e.g. an acoustical and/or an optical alarm signal), when a device checks whether or not a link can be established at a given power level. In an embodiment, the alarm is distinct for a given power level. In an embodiment, the alarm changes in case of success or failure in setting up a link at the given power level, e.g. in that different alarm signals are issued in the two cases.

In an embodiment, the conclusion indicating that the two communication devices are very close to each other is made in a pre-selected one of the two devices (e.g. if a first of the two devices is a charging station or an audio selection device (audio gateway) or a mobile telephone and the second device is a listening device adapted for wirelessly communicating with the first device). In an embodiment, the conclusion indicating that the two communication devices are very close to each other is made in the individual devices based on a signal from a third device (the third device being e.g. a box for keeping the two devices when not in use, a charging station for recharging rechargeable batteries of the devices, etc.).

In an embodiment, the link quality is evaluated and the transmission power of the transmitting device is regulated according to a predefined scheme, e.g. at regular intervals in time, e.g. ≧every 100 s, such as ≧every 10 s or such as ≧every 1 s (i.e. with a frequency ≦1 Hz). Alternatively, the time instances of evaluating the link quality may be dynamically determined, e.g. dependent upon the current and/or an intended future Tx-power level or based on recorded link qualities or power levels for a preceding time interval, such as the last hour or the last 10 minutes or the last minute or the last 10 s or the last 1 s or less. In an embodiment, the time between evaluations of link quality and possible regulation of the Tx-power level decreases with increasing present Tx-power level.

In an embodiment, the link quality is continuously monitored. In an embodiment, the Tx-power level is continuously regulated. In an embodiment, Tx-power level is regulated (if changes are necessary) according to a predefined scheme, e.g. with a delay of 1 s or 5 s or 10 s or 20 s or dependent upon the current link quality or the rate of change of link quality (a large rate of change of link quality inducing a rapid change of Tx-power level).

In an embodiment, the measure of link quality (LQ) is e.g. based on the signal strength of the received signal and/or its bit error rate and/or the gain-settings of the receiver (e.g. of an automatic gain control (AGC) unit) of the receiving (or transmitting) device. An advantage of using an AGC-setting and/or a signal strength of the received signal as opposed to a bit error rate is a faster indication (the determination of a bit error rate is dependent on the reception of a number of bits (e.g. arranged in frames), thus requiring a corresponding amount of time). Preferably the measures are combined to get a link quality measure providing 'the best of several worlds'. In an embodiment, the measure of the quality of the link is based on the gain of an automatic gain control (AGC) unit necessary to achieve a predefined signal to noise ratio (S/N) or bit error rate (BER) of the received signal. In an embodiment, the measure of the quality of the link is additionally based on field strength of the received signal.

In an embodiment, the measure of the quality of the link is based on the gain settings of an automatic gain control unit in the receiving (or transmitting) communication device averaged over time. In an embodiment, a running average of a predefined number of the last gain settings is calculated and the latest result is transmitted to the transmitting communication device as a link quality (LQ) measure. In an embodiment, the link quality measure is extracted from a signal received by thr transmitting device from another (receiving) device.

In an embodiment, the link protocol comprises an error detecting code for allowing a detection of bit errors, e.g. by performing a cyclic redundancy check (CRC) of packages of the received signal, e.g. allowing the calculation of a bit error rate (BER). In an embodiment, the link quality evaluation unit is adapted for making such bit error detection and processing to derive an error rate, e.g. averaged over a specific number of frames (e.g. 10-50 frames) or a specific time (e.g. 1-5 s).

In an embodiment, the link quality evaluation unit is adapted to register if an error in a package is detected. In an embodiment, the link quality evaluation unit is adapted to increase an error count if an error in a package is detected.

In an embodiment, the link quality evaluation unit of the receiving (or transmitting) device is adapted to combine one or more link quality measures for determining an appropriate transmit power level for the transmitting device. In an embodiment, the AGC settings are combined with a CRC-check, e.g. in such a way that only AGC settings for error-free frames are stored and used for the estimate of link quality.

In an embodiment, the link protocol comprises an error correcting code. In an embodiment, the link quality measure is left unmodified, if the error correcting code is able to correct the error. In an embodiment, the number of corrected errors is counted and the link quality measure is modified, when a specific rate or number of error corrections is exceeded.

In an embodiment, the receiving communication device comprises a memory for storing values of the measure of the quality of the link at different points in time.

In an embodiment, the transmitting communication device is adapted to adjust the transmit power in a number of predefined (normal) levels between a minimum level and a maximum level. In an embodiment, the communication system is adapted to provide that a default power setting (e.g. after reset or power-up) of the transmitting communication device is the highest (maximum) power level. This has the advantage of providing the best conditions for establishing a connection to the other communication device, e.g. during startup (e.g. after a full or partial power-down). If, after startup, no link can be established at the maximum power level (indicating that the device is outside the Typical zone for operation relative to the other device), it is checked whether a link can be established at an extremely low level. Thereby it can be concluded, whether the device is in a VeryClose zone or a VeryFar zone relative to the other device (or alternatively that the other device is not powered up). In an embodiment, the power levels are equidistant on a linear scale. In an embodiment, the power levels are equidistant on a logarithmic scale (in dB). In an embodiment, the steps between neighboring power levels increase from the highest to the lowest level (e.g. in absolute terms or in logarithmic terms).

In an embodiment, the transmit power is increased from one transmit level to a higher level, such as a neighboring higher level, when the measure of the quality of the link, e.g. an error rate, is larger than or equal to a predefined value (e.g. $ER_{high}$) In an embodiment, the transmit power is decreased from one transmit level to a lower level, such as a neighboring lower level, when the measure of the quality of the link, e.g. an error rate, is smaller than or equal to a predefined value (e.g. $ER_{low}$) In an embodiment, no regulation is performed when the measure of the quality of the link, e.g. an error rate, is in a range between a predefined low value (e.g. $ER_{low}$) and a predefined high value (e.g. $ER_{high}$).

In an embodiment, a predetermined functional relationship between the link quality measure and the resulting power level regulation is defined, e.g. as an algorithm or a table, and stored in either of the transmitting or receiving devices (or both).

In an embodiment, the transmit power is increased from one transmit level to a maximum level when the measure of the quality of the link is larger than or equal to a predefined value $N_{crit}$, e.g., $\geq ER_{crit}$, when the measure of the quality of the link is an error rate. In an embodiment, the transmit power is increased from one transmit level to a maximum level when the measure of the link is an error count (e.g. CRC) and $N_{crit}$ is in the range from 4-10, e.g. 5 consecutive errors (i.e. $N_{crit}$ consecutive frames have been identified as erroneous).

In an embodiment, the communication between the first and second communication device is SIMPLEX (i.e. only one device is transmitting at a time). In an embodiment, the communication between the first and second communication device is DUPLEX (i.e. the two devices are allowed to transmit simultaneously).

A Method:

A method of controlling power consumption in a wireless link between two portable communication devices is furthermore provided by the present invention, wherein the transmit power of a transmitting device is dynamically adjusted based on a measure of the quality of the link.

In a second aspect a method of controlling power consumption in a wireless two-way link between two communication devices, one of which comprises a portable listening device is provided. The method comprises providing that the transmit power of a transmitting device is dynamically adjusted based on a measure of the quality of the link, wherein the dynamic transmit power regulation is used to implement a partial power-down mode of the system, when the two communication devices are expected NOT to be in a normal use, wherein the partial power-down mode at least comprises a power-down of the components related to the wireless link.

It is intended that the structural features of the system described above, in the detailed description of 'mode(s) for carrying out the invention' and in the claims can be combined with the method, when appropriately substituted by a corresponding process and vice versa. Embodiments of the method have the same advantages as the corresponding systems.

In an embodiment, the method comprises providing that the first, transmitting device is set in an operational state (or Normal mode) when the first and second devices are within a Typical range of distances from each other, the Typical zone, as detected by a transmitting device in that a link can be established between the two devices using a normal transmit power (e.g. with a predefined link quality, e.g. a predefined maximum bit error rate).

In an embodiment, the method comprises providing that the first, transmitting device can detect whether it is located in a VeryClose zone, where the two devices are closer to each other than in the Typical zone and in which case the transmitting device is set in a VeryClose mode and/or providing that the first, transmitting device can detect whether it is located in a VeryFar zone, where the two devices are farther away from each other than in the Typical zone and in which case the transmitting device is set in a VeryFar mode.

In an embodiment, the method comprises providing that the current and previous modes of operation of the first, transmitting device are available (stored).

In an embodiment, the method comprises providing a wake-up algorithm adapted to identify at predefined points in time whether or not a current partial power-down mode shall continue (and if not, in which mode it shall be transferred to).

The method provides a number of normal transmit power levels (between a minimum normal voltage and a maximum normal voltage) to be used in a Normal mode of operation. The method further provides an extremely low transmit power level (smaller than the minimum normal transmit power level) adapted to allow a link between the two devices to be established (e.g. with a predefined link quality) when the two devices are in close proximity of each other, e.g. in a VeryClose zone relative to each other (e.g. within a distance of less than 5 cm from each other).

In an embodiment, the method comprises that a current partial power-down mode is continued—in case the previous mode was a VeryClose mode—if a link to the other device can be established (e.g. with a predefined link quality) with an extremely low transmit power level, or if this is not the case and if a link can NOT be established at a normal transmit power level, or—in case the previous mode was a VeryFar mode—if a link to the other device can neither be established (e.g. with a predefined link quality) with an extremely low transmit power level, nor with a maximum normal power level.

In an embodiment, the method comprises providing that the transmitting device is otherwise set in a Normal mode, if a link to the other device can be established at a normal transmit power level (e.g. with a predefined link quality).

A Data Processing System:

A data processing system comprising a processor and program code means for causing the processor to perform the method described above, in the detailed description of 'mode(s) for carrying out the invention' and in the claims is furthermore provided by the present invention.

A Computer-Readable Medium:

A tangible computer-readable medium storing a computer program comprising program code means for causing a data processing system to perform the method described above, in the detailed description of 'mode(s) for carrying out the invention' and in the claims, when said computer program is executed on the data processing system is furthermore provided by the present invention. In addition to being stored on a tangible medium such as diskettes, CD-ROM-, DVD-, or hard disk media, or any other machine readable medium, the computer program can also be transmitted via a transmission medium such as a wired or wireless link or a network, e.g. the Internet, and loaded into a data processing system for being executed at a location different from that of the tangible medium.

Further objects of the invention are achieved by the embodiments defined in the dependent claims and in the detailed description of the invention.

As used herein, the singular forms "a," "an," and "the" are intended to include the plural forms as well (i.e. to have the meaning "at least one"), unless expressly stated otherwise. It will be further understood that the terms "includes," "comprises," "including," and/or "comprising," when used in this specification, specify the presence of stated features, integers, steps, operations, elements, and/or components, but do not preclude the presence or addition of one or more other features, integers, steps, operations, elements, components, and/or groups thereof. It will be understood that when an element is referred to as being "connected" or "coupled" to another element, it can be directly connected or coupled to the other element or intervening elements maybe present, unless expressly stated otherwise. Furthermore, "connected" or "coupled" as used herein may include wirelessly connected or coupled. As used herein, the term "and/or" includes any and all combinations of one or more of the associated listed items. The steps of any method disclosed herein do not have to be performed in the exact order disclosed, unless expressly stated otherwise.

BRIEF DESCRIPTION OF DRAWINGS

The invention will be explained more fully below in connection with a preferred embodiment and with reference to the drawings in which:

FIG. 3 shows examples of algorithms for setting Tx-power levels in the transmitting device based on measured link quality parameters, e.g. in the receiving device, in FIG. 3a comments on different power levels are given, in FIG. 3b the AGC-level is used and in FIG. 3c the number of CRC errors per time unit is used as a link quality estimate, while FIG. 3d shows a state diagram for three different link quality measures, FIG. 4 shows a communication system comprising power level regulation according to an embodiment of the invention, FIG. 5 shows an example of the transmission ranges of the transmitter power regulation for a wireless link for a communication system according to an embodiment of the invention.

The figures are schematic and simplified for clarity, and they just show details which are essential to the understanding of the invention, while other details are left out.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

MODE(S) FOR CARRYING OUT THE INVENTION

Figure 1A:
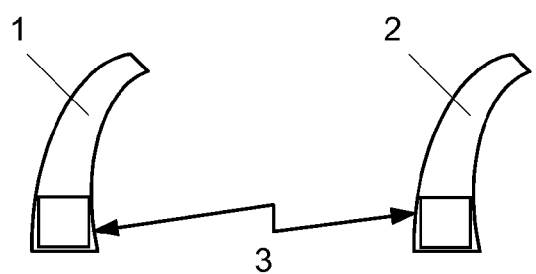
FIG. 1 shows two examples of communication systems according to embodiments of the invention.
Figure 1B:
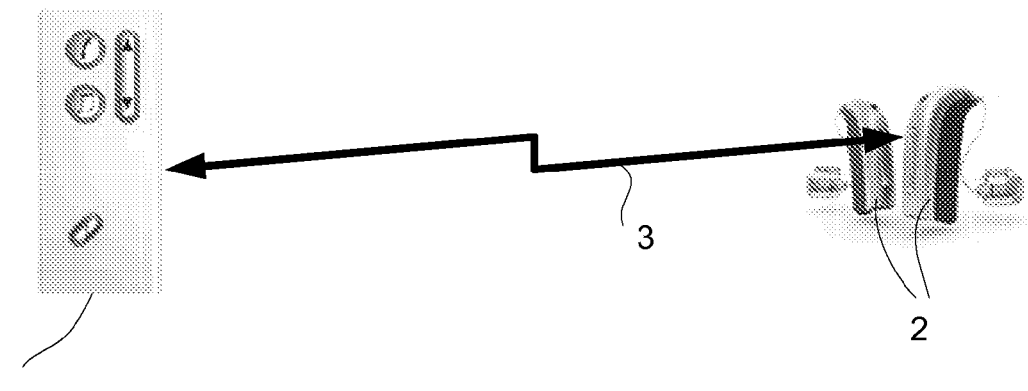

FIG. 1 generally illustrates a wireless link 3 between first and second communication devices 1, 2. Applications of the present invention include the wireless communication between two body-worn, low power communication devices, e.g. two hearing instruments (cf. e.g. FIG. 1a) or between an audio selection device (audio gateway) and one or more hearing instruments (cf. e.g. FIG. 1b). Alternatively, the communication devices 1, 2 could be a pair of headphones, a pair of hearing protective ear plugs, a mobile telephone and a listening device, an entertainment device (e.g. a music player) and a listening device, etc.

In the following (FIG. 1a), an embodiment of the invention is exemplified by a binaural hearing aid system comprising two hearing instruments adapted to be worn at and/or in each ear of a user, the hearing instruments having a wireless link between them for exchanging control or status information (and possibly audio signals) between them. In an embodiment, no audio signals are exchanged between the two hearing instruments. In an embodiment, only control or status information is exchanged between the two hearing instruments.

FIG. 1a shows a binaural hearing aid system comprising a first and a second hearing instrument 1, 2 with a wireless link 3 for establishing communication between the two hearing instruments. Each hearing instrument comprises transceivers for establishing the wireless link. Each hearing instrument has a local energy storage (e.g. a battery, such as a rechargeable battery) for providing power to the electronic parts of the instrument in question, including the transceiver. The wireless link may e.g. be based on near-field coupling between the instruments, such as on an inductive coupling between respective induction coils in each of the hearing instruments. Alternatively, the wireless link may be based on a capacitive coupling or on radiated fields. Various aspects of inductive communication are e.g. discussed in EP 1 107 472 A2 and US 2005/0110700 A1. WO 2005/055654 and WO 2005/053179 describe various aspects of a hearing aid comprising an induction coil for inductive communication with other units. The present disclosed concepts of power regulation can in general be used for any type of link and frequency or bit rate. In an embodiment, data are exchanged with a bit rate below 500 kHz, e.g. in the range between 100 kHz and 400 kHz, e.g. between 200 kHz and 300 kHz.

FIG. 1b illustrates another application of the present invention wherein the transmit power of a transmitting device 1, 2 is regulated in different levels according to a link quality measure of a wireless link 3 between an audio selection device 1 for receiving a number of audio signals, selecting one (e.g. via a user activated element) and transmitting the selected audio signal to one or more hearing instruments 2. The same principles of operation as indicated for the embodiment of FIG. 1a can be used for the embodiment of FIG. 1b (possibly adapted to the different requirements to the communication between the two (or more) devices in question, e.g. as regards bandwidth, mutual distances, etc.). Different power levels and/or regulating algorithms, may e.g. be implemented in the audio selection device and in the hearing instrument(s). In an embodiment, the two hearing instruments are adapted to establish a wireless link between them for exchanging status information. In an embodiment, the two hearing instruments between them constitute a communication system according to the present invention (as e.g. illustrated in FIG. 1a).

Figure 2A:
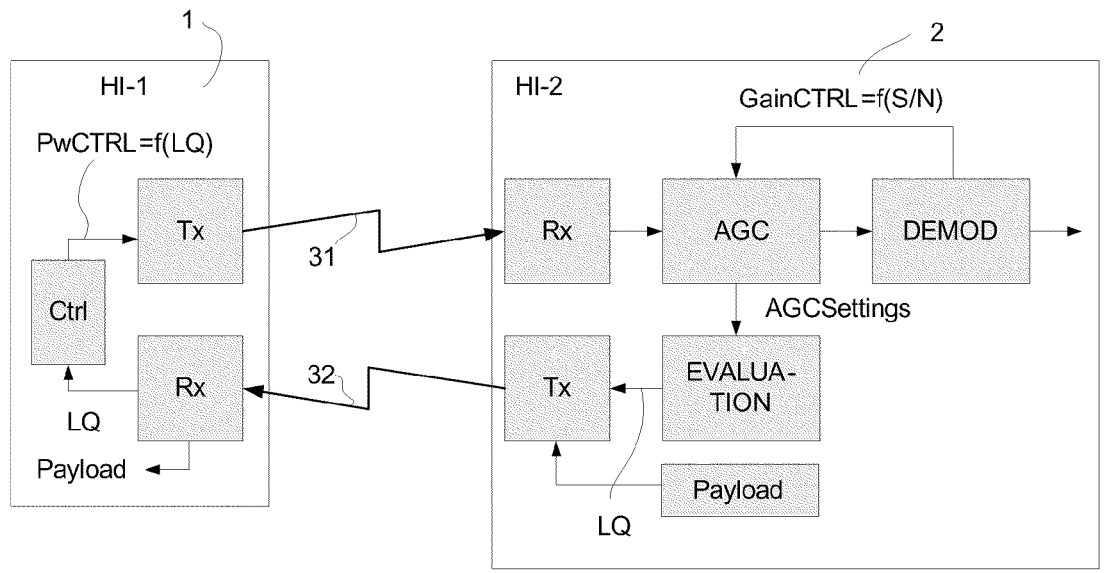
FIG. 2 shows two different, more detailed examples of the communication system depicted in FIG. 1, the two examples using different quality estimates (based on average AGC-level in FIG. 2a, and including CRC errors in FIG. 2b)
Figure 2B:
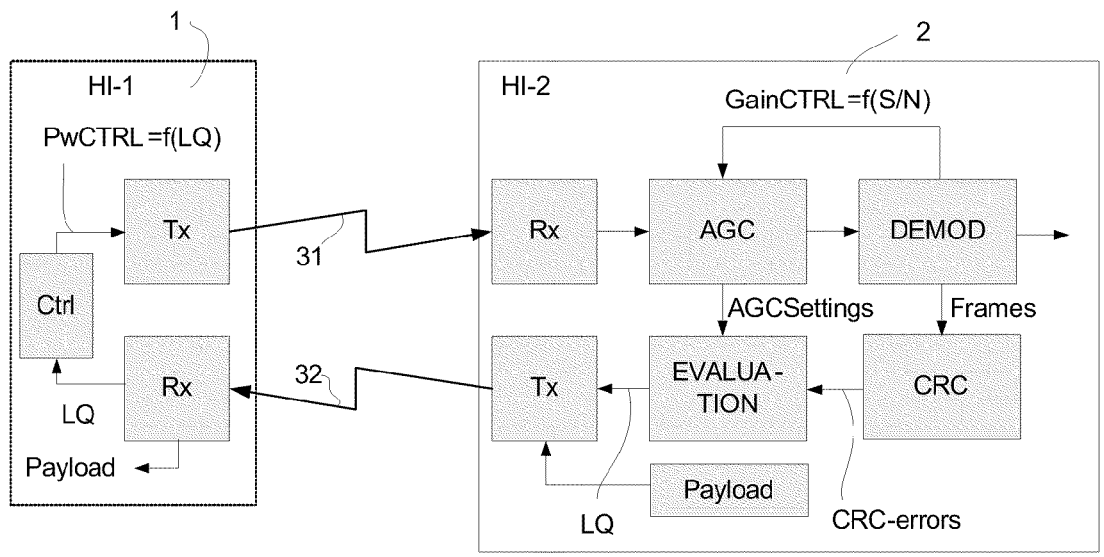

FIG. 2 shows two different, more detailed examples of the communication system depicted in FIG. 1, the two examples using different quality estimates (based on average AGC-level in FIG. 2a, and including CRC errors in FIG. 2b).

Binaural communication is in the embodiments of FIG. 2 based on adaptive transmitter power regulation. In both cases, the receiver Automatic Gain Control (AGC) circuitry settings of HI-2 provide a measure of the link quality (e.g. based on the AGC regulating gain until a predefined S/N-ratio of the demodulated signal is achieved, for example a long term average gain setting figure), a relatively low AGC-setting indicating relatively good link quality, and a relatively high AGC-setting indicating relatively poor link quality. This measure of the link quality relating to a transmission from a first 1 to a second 2 hearing instrument is derived in the second hearing instrument 2 (HI-2 in FIG. 2) and is transmitted to the first hearing instrument 1 (HI-1 in FIG. 2) of the binaural hearing aid system. Based on the received measure, the first hearing instrument 1 (HI-1) regulates the transmitted power. The same scheme is used for a transmission of a link quality measure from the first (HI-1) to the second (HI-2) hearing instrument (the first and second hearing instruments comprising identical evaluation and control units, but only one 'set' is shown in FIG. 2) for regulating the transmit power of the second (HI-2) hearing instrument. Alternatively, the measure of link quality can be extracted in the same device whose transmit level is to be regulated from a signal received the or another communication device. The possible regulation frequency (i.e. the frequency with which a check is made as to whether the quality measure has changed sufficiently to initiate a regulation) can be adapted to the practical situation, e.g. $\geq 0.01$ Hz, or $\geq 0.1$ Hz, such as $\geq 1$ Hz, or continuously (e.g. as often as the discrete time instances in which data in a digital representation are handled allows, e.g. every time a frame or a predefined number of frames has/have been received). Typically, it is not expected that regulation happens very often, because during normal operation the link quality is relatively stable (because of a constant relative location of the two devices, constant transmission conditions, cf. FIG. 7 and the corresponding description below).

Default power setting of a particular hearing instrument (e.g. during start-up) is advantageously set to the highest possible power level to provide the best conditions for establishing a connection to the other hearing instrument. If a wireless connection cannot be established (with the highest possible power level), this is taken to indicate an extremely low link quality, further indicating that the two HIs are either too far from (received level too low) or too close (saturation) to each other (cf. e.g. FIG. 3d). The power regulation system reacts by setting the transmitter to the lowest level of power for reestablishing wireless connection (extreme low power). VeryCloseMode: If this reestablishes the wireless link, it is concluded that the two devices are very close to each other (cf. VeryClose zone of FIG. 5). Preferably, this induces the transfer of the device into a sleep mode comprising a partial power down of the device (e.g. at least including a power down of the wireless interface). In this mode, the system is adapted to 'wake-up' and test the link quality according to a predefined pattern, e.g. with a certain frequency, to test whether the conditions have changed (e.g. with a predefined frequency, e.g. larger than 0.001 Hz or according to another appropriate scheme adapted to provide a compromise between low power consumption and automatic (timely) verification of a change of localization state of the devices relative to each other). VeryFarMode: If a wireless connection cannot be established (with the lowest ('extremely low') power level), this situation (no link can be established for any of the highest and lowest link-power levels) is in the present embodiment taken to indicate that the two devices are very far from each other (cf. VeryFar zone of FIG. 5). In an embodiment, the system reacts by telling the user that it cannot "see" the opposite device, e.g. by issuing an alarm signal (e.g. an acoustical alarm signal (e.g. a number of 'beeps') and/or an optical alarm signal (e.g. a number of 'blinks')) by the device detecting the incident (typically both devices). The alarm signal is e.g. initially issued with a predefined frequency, e.g. every 10 s, e.g. with a decreasing frequency after the change to the VeryFarMode. In an embodiment, the device is adapted to be transferred to a sleep mode comprising a partial power down of the device, e.g. a certain time after entering the VeryFarMode, e.g. after 5 minutes (to give a user time to find a misplaced device). In an embodiment, an alarm is issued every time the device wakes up from the sleep mode to detect whether a change of the localization situation has occurred.

FIG. 2a illustrates an example of the regulation of transmitted power in the first hearing instrument 1 (HI-1) based on a quality measure of the wireless link (3 in FIG. 1) derived from the received signal in the second hearing instrument 2 (HI-2). Respective antennas (not shown) for transmitting and receiving the wireless signals are coupled to transceivers (Tx, Rx) of the respective hearing instruments and adapted to the kind of transmission and frequency range used by the wireless link. A transmitted signal 31 from a transmitting part Tx of a transceiver of HI-1 is received by a receiving part Rx of a transceiver of HI-2. The automatic gain control unit (AGC) of HI-2 tries to adjust gain for optimum demodulator performance to achieve a predefined S/N-ratio of the signal as monitored in the demodulator (DEMOD), cf. control signal GainCTRL from DEMOD to AGC. In an embodiment, the received signal is a digital signal and the AGC setting for each received frame is stored and averaged over time (e.g. over 20-40 frames) in the EVALUATION unit. The resulting signal, LQ is a measure of the link quality. This signal 32 is transmitted by a transmitter part Tx of the transceiver of HI-2 via the wireless link from HI-2 to HI-1, where it is received in a receiving part Rx of the transceiver of HI-1 and fed to a power control unit (Ctrl) and used to regulate the transmit power of the transmitting part Tx of the transceiver in HI-1 (based on output signal PwrCTRL from the power control unit Ctrl). In the receiving communication device (HI-2) a payload signal is generated in a payload block (Payload) and forwarded to the transmit part Tx of the transceiver of HI-2, where it is transmitted via the wireless link 32 and received in the receiver part Rx of the transceiver of the transmitting communication device (HI-1). The link quality signal and the payload signal may be transmitted in different time slots or the link quality signal may be embedded in the payload signal (e.g. together with other control signals exchanged between the devices, e.g. in a separate part of a transmitted package). In the receiver the payload signal (Payload) is forwarded to other functional parts of HI-1 (e.g. including gain control and demodulating blocks (not shown)). In addition to an average value of the gain setting, the link quality control measure LQ may be influenced by a measure of the field strength of the received signal. A field strength monitoring unit may form part of the AGC-unit.

FIG. 2b illustrates another example of the regulation of transmitted power in the first hearing instrument 1 (HI-1) based on a quality measure of the wireless link (3 in FIG. 1) derived from the received signal in the second hearing instrument 2 (HI-2). The units and function of the embodiments of FIGS. 2a and 2b are largely identical, except that FIG. 2b contains a unit (CRC) for performing a cyclic redundancy check on a frame by frame basis of the demodulated signal (cf. input Frames from the DEMOD-unit to the CRC-unit). Each CRC error is counted by an EVALUATION unit based on an input (CRC-errors) from the CRC-unit. The resulting signal, LQ, is a measure of the link quality and is e.g. based solely on the CRC-error count, or alternatively, and preferably, on a combination of the average AGC settings and the CRC-error count, or alternatively on a combination of the average AGC settings, the field strength of the received signal and the CRC-error count. This signal 32 is transmitted by a transmitter part Tx of the transceiver of HI-2 via the wireless link from HI-2 to HI-1, where it is received in a receiving part Rx of the transceiver of HI-1 and used to regulate the transmit power of the transmitting part Tx of the transceiver in HI-1 (based on signal PwrCTRL) via control unit Ctrl as indicated in connection with FIG. 2a above.

The power of the transmitter Tx is e.g. regulated by adjusting the pulse width of a carrier (as e.g. described in EP 1 777 644 A1), injected in the serial tank circuit (Tx-unit). The power level can e.g. be controlled by firmware, e.g. based on factory aligned power tables, comprising a number of predefined power levels e.g. 2-20 levels, such as 2, 3 or 4 or 5-10 levels (cf. e.g. FIG. 3). The lowest power level(s) is/are e.g. adapted to implement a VeryClose mode and possibly a sleep mode situation of one or both devices (when a device is in a VeryCloseMode or VeryFarMode).

Embodiments of a communication system according to the invention have the advantage of minimizing current consumption (and thereby minimizing artifacts) by regulating the transmitted power in a first device dynamically based on a quality figure received from the second device or extracted in the first device from a signal received from the second device.

FIG. 3 shows examples of algorithms for setting Tx-power levels in the transmitting device based on measured link quality parameters, e.g. in the receiving device, in FIG. 3a comments on different power levels are given, in FIG. 3b the AGC-level is used and in FIG. 3c the number of CRC errors per time unit is used as a link quality estimate, wile FIG. 3d shows a state diagram for three different link quality measures.

FIG. 3a shows a proposal for power settings. Five level settings are defined. The first setting PL0 ensures that the system has range enough for all (realistic) conditions (when devices are located in the normal operation range of distances, Typical zone in FIG. 5), and is the default setting. All other settings are given relative to PL0. The quality measure can e.g. be based on bit error rate (BER) as measured e.g. in the receiving device. PL1, PL2, PL3 indicate power levels appropriate for normal operation of the wireless link between the two devices. PL4 represents a ('extremely low', PL(VC)) power level adequate for establishing a link in a situation where the two devices are in a VeryClose zone (as indicated in FIG. 5), much closer, e.g. 1-5 cm from each other, than the normal operating distance of the devices, e.g. 15-25 cm from each other (Typical zone in FIG. 5).

FIG. 3b shows another proposal for the number of power level settings and a corresponding quality measure, here AGC levels. For each power level PLn (here n=0 denotes maximum power and n=5 denotes minimum power) minimum (AGCn (low)) and maximum (AGCn(high)) AGC-settings are defined. In an embodiment, the minimum and maximum AGC settings are identical for all power levels (n=0-5), i.e. AGCn(low)=AGC(low) and AGCn(high)=AGC(high), respectively, irrespective of power level n. If the AGC setting at a given power level PLn of the transmitter of the transmitting device exceeds the range defined by ]AGCn(low); AGCn (high)](e.g. averaged over a predefined time period), a regulation to change the power level of the transmitter can advantageously be made (possibly after a predetermined delay). Any number of power levels other than 5 can of course be implemented depending on the actual application.

An algorithm for a quality measure based on AGC levels as indicated in FIG. 3$b$ may comprise:
At Given Intermediate Transmitter Power Levels PLn ($n_{min}$<n<$n_{max}$):
 IF current AGC(PLn)≧AGCn(high), increase power level of transmitter to PL(n−1).
 IF current AGC(PLn)<AGCn(low), decrease level of transmitter to PL(n+1).
At Minimum Transmitter Power Level (n=$n_{max}$):
 IF a valid link can be established (LINK OK in FIG. 3$b$), set device to sleep mode (PWD in FIG. 3$b$). IF no valid link can be established (LINK NOK in FIG. 3$b$), e.g. after a wake-up from a sleep mode (possibly indicating a change of link quality), increase power level of transmitter to the maximum power level PL$n_{max}$. (PL0 in FIG. 3$b$).
At Maximum Transmitter Power Level (n=$n_{min}$):
 IF current AGC(PL$n_{min}$)≧AGC$n_{min}$(high), indicating a situation where connection is currently not possible, set device to sleep mode (PWD in FIG. 3$b$) (possibly after a certain predefined time, and/or the issuance of an alarm). IF current AGC(PL$n_{min}$)<AGC$n_{min}$(low), decrease power level of transmitter to PL($n_{min}$+1).

The actions may be performed after a delay corresponding to the action in question, e.g. IF current AGC(PLn)≧AGCn (high), the power level of transmitter is increased to PL(n−1) after a delay(PLn,PL(n−1)) possibly depending on the current (PLn) and intended future (PL(n−1)) power level.

FIG. 3$c$ shows yet another proposal for power level settings and a corresponding quality measure, here BER (e.g. number of CRC errors per time unit).

An algorithm for a quality measure ER (error rate) based on number of CRC errors per unit in time as indicated in FIG. 3$c$ may comprise:
At a Given Intermediate Transmitter Power Level PLn ($n_{min}$<n<$n_{max}$):
 IF current CRC error rate ER(PLn)≧$ER_{high}$, increase power level=>PL=PL(n−1).
 IF current consecutive CRC(PLn)≧$N_{crit}$, increase power to maximum level=>PL=PL$n_{min}$ (set CRC-count to 0).
 IF current CRC error rate ER(PLn)≦$ER_{low}$, decrease power level=>PL=PL(n+1).
At Maximum Transmitter Power Level (n=$n_{min}$):
 IF current CRC error rate ER(PL$n_{min}$)≧$ER_{high}$, keep power level=>PL=PL($n_{min}$).
 IF current consecutive CRC(PL$n_{min}$)≧$N_{crit}$ indicating a situation where connection is currently not possible, =>decrease power to minimum level PL=PL$n_{max}$ (set CRC-count to 0)
 IF current CRC error rate ER(PL$n_{min}$)≦$ER_{low}$, decrease power level=>PL=PL($n_{min}$+1).
At Minimum Transmitter Power Level (n=$n_{max}$):
 IF a valid link can be established, CRC error rate ER(PL$n_{max}$)≦$ER_{low}$ (or ≦$ER_{high}$) (LINK OK in FIG. 3$c$), set device to sleep mode (PWD in FIG. 3$c$).
 If no valid link can be established, e.g. IF current consecutive CRC(PL$n_{max}$)≧$N_{crit}$ (LINK NOK in FIG. 3$c$) 1) increase power level of transmitter to the maximum power level PL$n_{min}$, if the previous mode was a sleep mode and 2) set device to sleep mode, if previous mode was a VeryFar mode.

Again, the actions may be performed after a delay corresponding to the action in question, e.g. IF current ER(PLn)≧$ER_{high}$, the power level of the transmitter is increased to PL(n−1) after a delay(PLn,PL(n−1)) possibly depending on the current and intended future power levels.

FIG. 3$d$ shows values of three link quality measures, CRC error rate, AGC setting and field strength (FS) for three different modes Typical, VeryFar and VeryClose. In the Typical mode, all three LQ measures have a normal value (e.g. values in a normal range, e.g. between a LOW and a HIGH value), here termed N. In the VeryFar mode the CRC and AGC measures have a high value H (e.g. values in a range above a certain HIGH value), whereas the FS measure has a low value L (e.g. values in a range below a certain LOW value). In the VeryClose mode the CRC and FS measures have a high value H (e.g. values in a range above a certain HIGH value), whereas the AGC measure has a low value L (e.g. values in a range below a certain LOW value).

FIG. 4 shows a communication system comprising power level regulation according to an embodiment of the invention.

FIG. 4 schematically shows an embodiment of a communication system equivalent to the embodiments of FIG. 2. Each communication device 1, 2 (DEV-1, DEV-2) comprises a transceiver (Tx, Rx) for establishing a two way wireless link 31, 32 between the two communication devices 1, 2. Each communication device 1, 2 further comprises a power level register unit (PWL) for storing a number of predetermined power levels of a transmitter (possibly including keeping track of the current link quality measure and the currently used power level, and possibly comprising corresponding values of power level and one or more link quality measures according to a predefined algorithm), an AGC register unit for storing and processing (e.g. averaging over time) current AGC settings of the receiving device (e.g. to receive a predetermined S/N) and a CRC error register unit for storing and processing (e.g. counting over time and e.g. averaging over time) the number of received frames containing CRC-errors. To ensure that single scattered disturbances do not force the transmitting device to immediately increase the power level, the CRC error register is advantageously inspected over a certain time (e.g. of the order of seconds). Although in the following only regulation of one Tx-direction is described (from device 1 to 2), in practice, identical or corresponding regulations concerning the Tx-direction (from device 2 to 1) may be performed in the second device 2 based on link quality measures e.g. generated in the first device 1.

The communication system is adapted to be initialized at a default power level after start-up (power-up). Advantageously the initial power level is the maximum power level (cf. PL0 in the examples in FIG. 3). At this power level the maximum achievable range ensures binaural communication (under normal conditions). Alternatively, any other initial power level may be chosen, as long as the regulation algorithm is appropriately adapted.

Every time the receiver receives a (valid) frame of data, the current AGC setting is stored in a register (AGC in FIG. 4 or e.g. in the EVALUATION unit of FIG. 2). At specific points in time (e.g. regularly or dynamically determined dependent upon the rate of change of the (current and stored) AGC-settings), the value is sampled (e.g. after averaging over a number of frames, e.g. 10-50) and transmitted to the transmitting device. Alternatively, a running average of the LQ measure (here AGC-settings) is continuously updated and transmitted to the transmitting device. The power level of the transmitter of the transmitting device is adjusted according to the received AGC level (by consulting the power level register (PWL, which may contain a receiver AGC-level vs. transmitter power level correspondence table or a corresponding algorithm (cf. e.g. FIG. 3$b$)). Alternatively, the power level may be determined in the receiving device by having the correspondence list stored there and then transmit the appropriate power level (or change in power level) to the transmitting device for regulating the transmitter. The selected power level for the individual transmitters (of a binaural system or of an asymmetric system containing two different devices) corresponding to a specific (e.g. average) link quality measure may be, but are not necessarily, identical.

In an embodiment, each communication device has a unique address (ID-1 and ID-2 in FIG. 4), which is used to enable reception of a specific transmission. Paired or grouped devices which should be able to communicate with each other are preferably adapted to know each other's addresses during manufacturing or in a later grouping process. In some applications, several addresses could occur within the link transmission range, e.g. in the scenario illustrated in FIG. 1b, where a first communication device (e.g. an audio selection device adapted for selecting and transmitting an audio signal among a multitude of audio signals (e.g. including one from a telephone) received by the audio selection device) is adapted to wirelessly communicate with at least two hearing instruments of a binaural fitting at the same time. Therefore the future transmitter power level (or the change in power level) or the link quality measure LQ determined in the receiving device and the ID address of the intended transmitting device (or that of the receiving device) should hence preferably both be forwarded from the receiving device to the transmitting device.

In an embodiment, the AGC averaging is only based on CRC-correct frames, i.e. decoded frames which have been subject to a cyclic redundancy check (or any other appropriate error detecting scheme in accordance with the transmission protocol used) and which were found to be error free.

In some situations, where two devices (e.g. two HIs) are placed physically very close to each other (resulting in link saturation), the system would be expected to detect a very low AGC setting AND a dramatically increased number of CRC errors. In such case, the transmit power is preferably set to a (extremely low) power level ($PL_{VC}$) lower than, such as substantially lower than (e.g. $\geq 10$ dB lower) the power levels used for normal operation, thereby enabling a valid link even at very close proximity of the two devices relative to each other (cf. VeryClose zone in FIG. 5).

If indeed a large number of CRC errors are detected (e.g. $ER(CRC) \geq N_{xcrit}/s$ or $N(CRC) \geq N_{crit}$ consecutive errors) while the AGC-setting is low, the transmitter of the transmitting device should be put into an extreme low power mode (e.g. PL5 in FIG. 3b) indicating that the two devices are in a VeryClose zone, to check whether a valid link can be established at this extreme low power level, and if so to possibly establish a sleep or partial power down mode. The system is adapted to 'wake-up' in the VeryCloseMode ($PL=PL_{VC}$) and test the link quality with a certain frequency (e.g. 1 Hz or 0.1 Hz or lower) to test whether the conditions have changed. If indeed a change has occurred, e.g. if the link between the two communication devices is lost (possibly indicating that the two devices have been removed from each other), the transmitter of the transmitting device is adapted to immediately try to reestablish the link by setting the transmit power to the highest level (PL0 in FIG. 3) and the transmitter of the other device could preferably be adapted to follow the same algorithm.

In general, the system is reacting relatively slowly (e.g. over seconds). The change in power levels should preferably happen seldom. The CRC and AGC setting registers are averaged over a number of frames (e.g. more than 10-20 frames) to avoid too much regulation. However, in the situation where a device wakes up from a sleep mode and concludes that the other device has been removed (because a valid link cannot be established at a very low power level $PL_{VC}$), the system should on the other hand react relatively fast (e.g. as fast as possible, e.g. <1 s).

FIG. 5 shows an example of the transmission ranges of the transmitter power regulation for a wireless link for a communication system according to an embodiment of the invention.

In an embodiment, the wireless link is based on inductive communication. The theoretical power reduction for a magnetic coupling M between adjacent inductive coils decreases with the distance r in the $3^{rd}$ power ($M \sim (1/r^3)$), i.e. resulting in a very rapid increase in coupling at low distances between the devices.

The distance termed Production test distance indicates the separation distance of first and second communication devices in a typical production alignment test (where the two devices are tested for their capability of setting up a valid link between them at maximum power level). The Typical zone is e.g. between a Typ. MIN distance (e.g. 15 cm) and a Typ. MAX distance (e.g. 25 cm), e.g. corresponding to the typical range for binaural communication between the two hearing instruments of a binaural fitting (i.e. corresponding to the practically foreseen range of ear-to-ear distances). The Production test distance is e.g. taken to be 28 cm. Other types of devices and/or types of wireless transmission may have other corresponding values.

The Typical zone is surrounded by buffer zones (a Lower Buffer zone and an Upper Buffer zone, respectively), where the link may still work depending on the practical circumstances.

In the VeryClose zone below the Lower Buffer zone, the system may be adapted to still be active so that binaural communication is possible, but possibly only for testing that a link can be established at a much reduced ('extremely low') power level (compared to the normal power levels used in the Typical zone) to indicate proximity of the two devices.

In the VeryFar zone above the Upper Buffer zone, the system is not able to establish a valid link between the two devices (e.g. indicated by a maximum AGC-setting and a vast amount of CRC-errors at maximum power level), the system is adapted to conclude that the devices are too far apart, i.e. (one of the devices) are located in a VeryFar zone.

The influence of parameter differences from one device or system to another should be realized. The transmission range of a system varies because of several factors, e.g. final accuracy of factory adjustment, receiver gain variation, temperature, battery voltage and transmit frequency. Therefore because of the expected discrete nature of the power regulation, two transmitters in the same system, could have different power settings. This reflects the introduction of the Upper and Lower Buffer zones in FIG. 5.

Figure 6A:
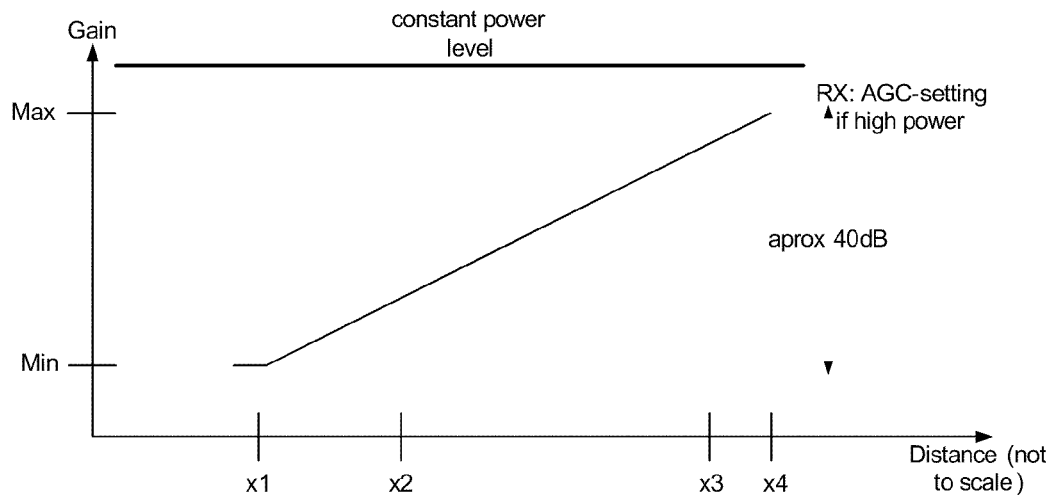
FIG. 6 shows the receiver gain settings versus distance without (FIG. 6a) and with power regulation according to the invention (FIG. 6b)
Figure 6B:
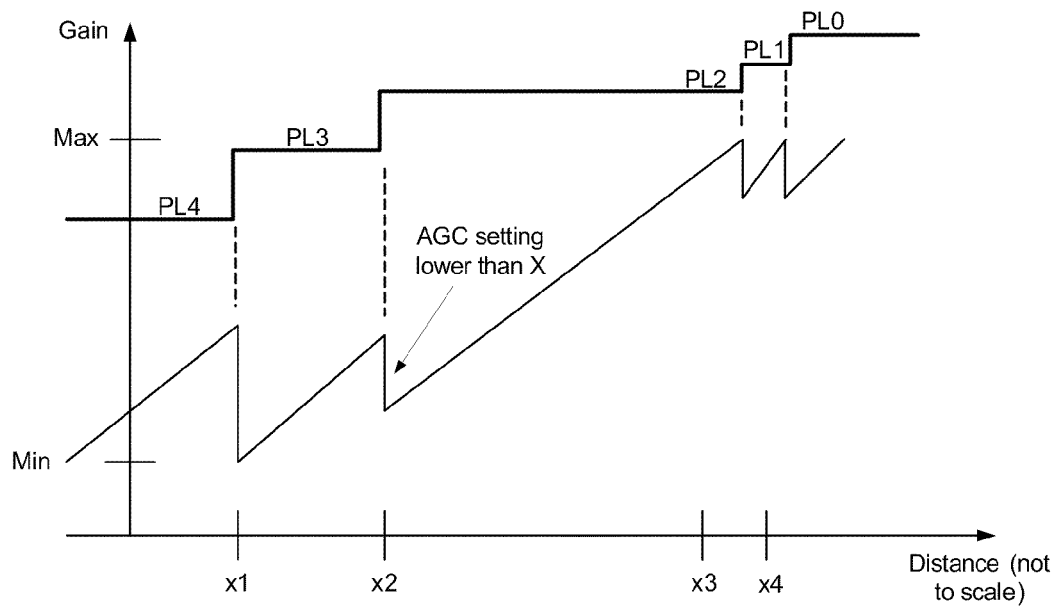

FIG. 6 shows the receiver gain settings versus distance without (FIG. 6a) and with power regulation according to the invention (FIG. 6b). Note the figures are not to scale.

FIG. 6a shows the AGC settings of a receiver of a receiving device without power regulation (i.e. without utilizing the present inventive scheme). In FIG. 6a the transmit power level is constant for all distances between the two devices and the AGC setting increases linearly (from a minimum level) with increasing distance. The scenario illustrated by FIG. 6b (depicting system reaction in case of a steadily increasing distance between the two device) is of course not a realistic, normal scenario for a pair of listening devices (where the two devices are located at a fixed distance determined by the ear-to-ear distance of the user). Further, the scenario of FIG. 6b does not take into account possible time delays between the application of a given gain setting in the receiver of the receiving device and a resulting regulation of a power level of the transmitter in the transmitting device (but assumes immediate response). FIG. 6b schematically shows an embodiment of a power regulation according to the invention illustrating a stepwise increase in power level and corresponding (discontinuous) stepwise linear increase in AGC. In the embodiment of FIG. 6b, the increase in AGC is shown to be linear with distance (for a constant S/N-ratio, reflecting an assumed corresponding linear decrease in e.g. S/N with increased distance and constant transmit power level (without AGC)). The dependence may, however, take on any other form than linear (including stepwise 'linear'), advantageously taking the form of a monotonous, (e.g. stepwise) increasing function (with increasing distance). Similarly, the steps in the power levels may be of equal size or take on any appropriate step size depending on the application and the transmission properties (protocol, environment, etc.).

Figure 7:
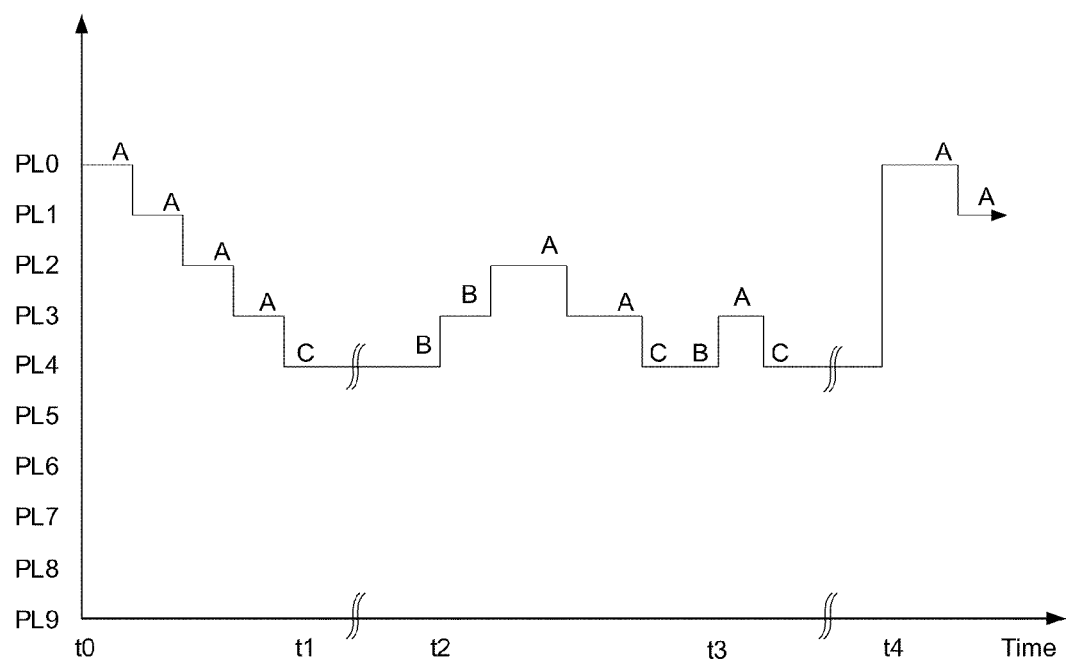
FIG. 7 shows a typical power regulation scenario for a communication system according to the invention.

FIG. 7 shows a typical power regulation scenario for a communication system according to the invention. The scenario illustrates the development over time of the power levels of each individual communication device of the system (e.g. a pair of hearing instruments) from the start-up of the system when located in its appropriate position (at the head of a user). FIG. 7 illustrates the gradual reduction of transmit power from an initial start level PL0 to an appropriate (lower) operating level (here PL4) for the given situation (head size, temperature, battery power, electromagnetic environment, etc.). The reduction from the maximum level PL0 to the operating level PL4 at time t1 occurs in steps via successive lower power levels PL1→PL2→PL3. The scenario includes occasional small disturbances (e.g. due to head movement, interference from other nearby sources, etc.). Such minor disturbances occur at times t2 and t3 in the scenario of FIG. 7, resulting in a temporary increase of the power level to a neighbouring higher power level (here from PL4 to PL3 to PL2 at t2 and from PL4 to PL3 at t3) and subsequent return to the appropriate operating level (here from PL4 to PL3 to PL4 at t2 and from PL3 to PL4 at t3). A major disturbance is assumed to occur at time t4, where the link quality measure and/or a local indicator indicates a loss of the link connection, resulting in an abrupt increase of the power level of the transmitter of the transmitting device (i.e. in practice of both devices) to the maximum power level (here PL0). If the link loss was due to a temporary incident (e.g. interference or the temporary removal of one or both devices and subsequent 'reinstallation'), the scenario (after the arrow) will continue as it started (as after start-up of the system) at t0 with gradual convergence of the power level to an appropriate operating power level (here PL4). The '//' indication on the time line (and corresponding indication on the graph) in FIG. 7 between time instances t1 and t2, and between t3 and t4, respectively, indicates a possible break in the time, i.e. a—not shown—time of shorter or longer duration without any regulation incidents.

The letters A, B, C, D on the graph before each change of power level indicate the use of a power level regulation algorithm in a transmitting device (based on a measured link quality e.g. received from the receiving device, or in case of loss of link, possibly detected by the transmitting device itself). The power level regulation algorithm has the following status indicators and corresponding actions:

| X | Link status | Action in Tx-device | Comment |
|---|---|---|---|
| A | PL too high | Select neighbouring lower PL | Based on Rx-AGC-BER |
| B | PL too low | Select neighbouring higher PL | Based on Rx-AGC-BER |
| C | PL OK | No change | Based on Rx-AGC-BER |
| D | Loss of link | Set PL to maximum | Based on Tx-AGC-BER |

The 'Loss of link' status in the transmitting device (Tx-device) is e.g. based on a LQ-measure (e.g. a combined AGC-, BER-measure) from the receiver of the transmitting device itself. In an embodiment, the link status in general may be based on an LQ measure from the receiver of the transmitting device itself.

Figure 8:
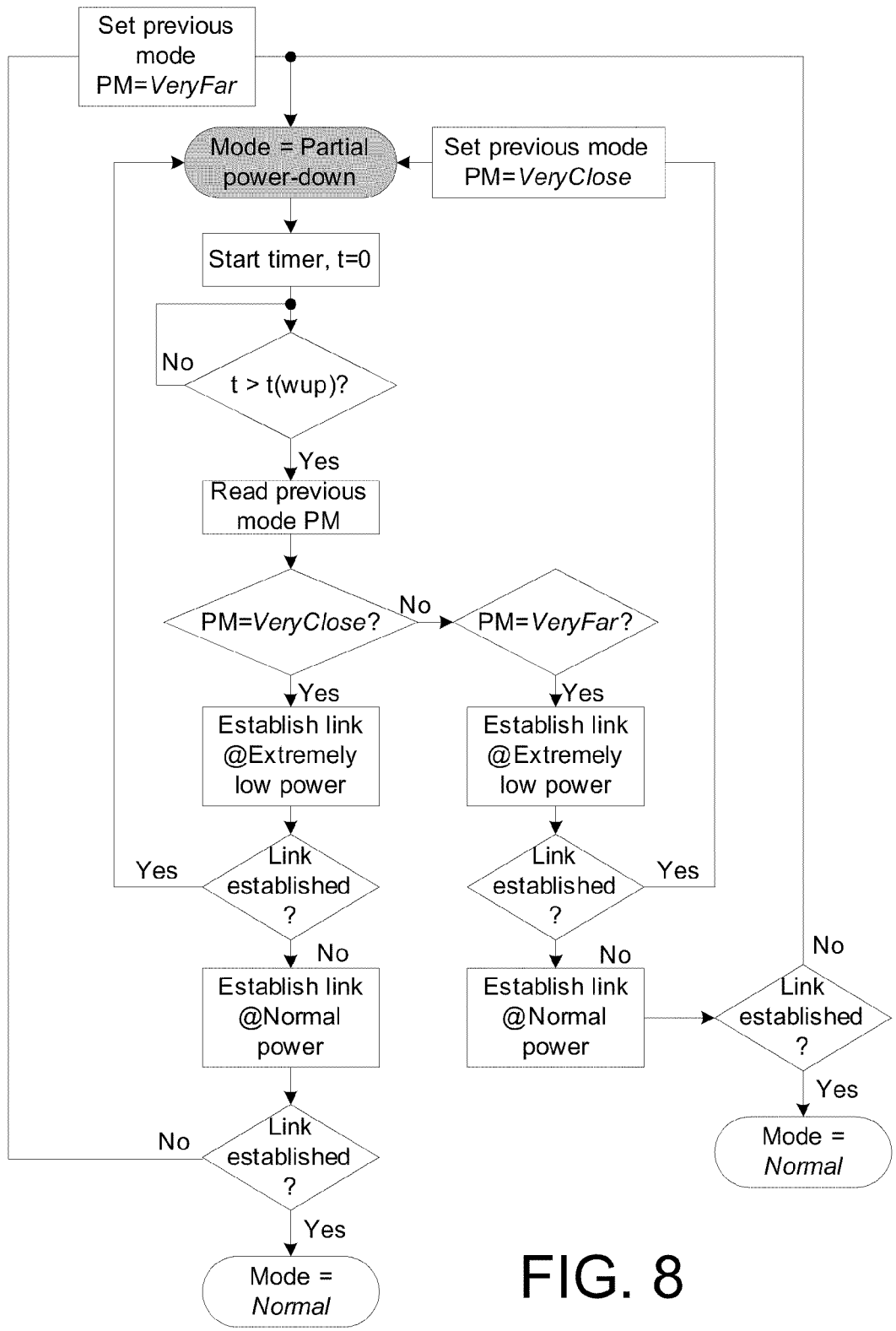
FIG. 8 shows a flow diagram of an exemplary wake-up procedure from a partial power-down (sleep) mode.

FIG. 8 shows a flow diagram of an exemplary wake-up procedure from a partial power-down (sleep) mode. The procedure is started from the grey shaded symbol indicating Mode=Partial power-down in the top part of the diagram. The wake-up procedure is different depending upon whether the partial power-down mode has been entered from a VeryClose mode or from a VeryFar mode (such modes being designated as the previous mode PM). The wake-up procedure describes actions to carry out at a predefined wake-up time t(wup), i.e. after the device in question has been in a partial power-down (sleep) mode for a predefined wake-up time t(wup) (since the last execution of the wake-up procedure, cf. action Start timer, t=0 and decision t>t(wup)?). In an embodiment, the wake-up time is different depending upon whether the partial power-down mode has been entered from a VeryClose mode (PM=VeryClose) or from a VeryFar mode (PM=VeryFar). In an embodiment, the wake-up time is larger, when the partial power-down mode has been entered from the VeryClose mode than from the VeryFar mode, assuming that the Very-Close mode is a more stable one (typically entered by intention) than the VeryFar mode.

The flow diagram of the wake-up procedure defines that a current partial power-down mode is continued—in case the previous mode was a VeryClose mode—if a link to the other device can be established (e.g. with a predefined link quality) with an extremely low transmit power level, or if this is not the case and if a link can NOT be established at a normal transmit power level, or—in case the previous mode was a VeryFar mode—if a link to the other device can neither be established (e.g. with a predefined link quality) with an extremely low transmit power level, nor with a maximum normal power level. The device is otherwise set in a Normal mode (cf. terminator symbol indicating Mode=Normal in the bottom part of the diagram), if a link to the other device can be established at a normal transmit power level (e.g. with a predefined link quality).

The invention is defined by the features of the independent claim(s). Preferred embodiments are defined in the dependent claims. Any reference numerals in the claims are intended to be non-limiting for their scope.

Some preferred embodiments have been shown in the foregoing, but it should be stressed that the invention is not limited to these, but may be embodied in other ways within the subject-matter defined in the following claims.

REFERENCES

EP 1 860 914 A1 (PHONAK) Nov. 28, 2007
EP 1 107 472 A2 (SONY CORPORATION) Jun. 13, 2001
EP 1 777 644 A1 (OTICON) Apr. 25, 2007
US 2005/0110700 A1 (STARKEY LABORATORIES) May 26, 2005

WO 2005/055654 (STARKEY LABORATORIES, OTICON) Jun. 16, 2005
WO 2005/053179 (STARKEY LABORATORIES, OTICON) Jun. 9, 2005

The invention claimed is:

1. A communication system, comprising:
a first and a second communication device, each comprising
transmit and receive units for establishing a wireless link between the devices,
wherein at least the first communication device is a portable listening device and comprises a control unit for dynamically adjusting the transmit power of its transmit unit based on a measure of the quality of the link,
the system is configured to use the dynamic transmit power adjusting to implement a partial power-down mode of the system, when the two communication devices are expected not to be in a normal use,
the partial power-down mode at least comprises a power-down of the components related to the wireless link,
the system is configured to be in an operational state or Normal mode when the first and second devices are within a Typical range of distances from each other, the Typical zone, and
the system is further configured to detect whether a transmitting device is located in a VeryClose zone, where the two devices are closer to each other than in the Typical zone and in which case the system is in a VeryClose mode and to detect whether a transmitting device is located in a VeryFar zone, where the two devices are farther away from each other than in the Typical zone and in which case the system is in a VeryFar mode.

2. A communication system according to claim 1 wherein, the measure of the quality of the link is extracted in a link quality evaluation unit in the second, receiving communication device based on the signal received from the first, transmitting communication device or in a link quality evaluation unit in the first, transmitting communication device based on a signal received from the second, receiving communication device.

3. A communication system according to claim 1 adapted to transmit and receive signals according to a digital protocol, wherein the transmitted and received signals comprise data arranged in packets according to said protocol.

4. A communication system according to claim 1 wherein the receiving and/or the transmitting communication device comprise(s) a memory for storing values of the measure of the quality of the link at different points in time.

5. A communication system according to claim 1 wherein the transmitting communication device is adapted to adjust the transmit power in a number of predefined levels between a minimum level and a maximum level.

6. A communication system according to claim 1 wherein a transmitting device is adapted to issue an alarm signal to make a user aware of its current location, when said device is in a VeryFar zone.

7. A communication system according to claim 1 wherein each of the first and second devices comprises a memory and are adapted to detect which mode the system is currently in and to store its previous and current mode in said memory.

8. A communication system according to claim 1 wherein the wireless link is an inductive link based on an inductive coupling between antenna coils of the first and second communication device.

9. A communication system according to claim 1 wherein the second communication device comprises a listening device, or an audio gateway.

10. The communication system according to claim 9, wherein
the listening device is a hearing instrument.

11. A communication system, comprising:
a first and a second communication device, each comprising
transmit and receive units for establishing a wireless link between the devices,
wherein at least the first communication device is a portable listening device and comprises a control unit for dynamically adjusting the transmit power of its transmit unit based on a measure of the quality of the link,
the system is configured to use the dynamic transmit power regulation to implement a partial mode of the system, when the two communication devices are expected not to be in a normal use,
the partial power-down mode at least comprises a power-down of the components related to the wireless link, and
the communication system is configured to provide a number of normal transmit power levels, between a minimum normal voltage and a maximum normal voltage to be used in a Normal mode of operation.

12. A communication system according to claim 1 adapted to be in an operational state or Normal mode when the first and second devices are within a Typical range of distances from each other, the Typical zone, the system being adapted to detect whether a transmitting device is located in a VeryClose zone, where the two devices are closer to each other than in the Typical zone and in which case the system is in a VeryClose mode and/or to detect whether a transmitting device is located in a VeryFar zone, where the two devices are farther away from each other than in the Typical zone and in which case the system is in a VeryFar mode.

13. A communication system according to claim 11 adapted to provide an extremely low transmit power level smaller than the minimum normal transmit power level and adapted to allow a link between the two devices to be established when the two devices are in a VeryClose zone relative to each other.

14. A communication system, comprising:
a first and a second communication device, each comprising
transmit and receive units for establishing a wireless link between the devices,
wherein at least the first communication device is a portable listening device and comprises a control unit for dynamically adjusting the transmit power of its transmit unit based on a measure of the quality of the link,
the communication system is configured to use the dynamic transmit power regulation to implement a partial power-down mode of the system, when the two communication devices are expected not to be in a normal use,
the partial power-down mode at least comprises a power-down of the components related to the wireless link, and
the communication system is configured to regulate the Tx-power level with a predetermined delay after reception of a current link quality measure, the delay possibly depending on the current power level, and/or the intended future power level, and/or a value of the link quality measure and/or a rate of change of the link quality measure.

15. A method of controlling power consumption in a wireless two-way link between two communication devices, one of which comprises a portable listening device, the method comprising:

dynamically adjusting the transmit power of a transmitting device based on a measure of the quality of the link using the dynamic transmit power adjusting to implement a partial power-down mode of the system, when the two communication devices are expected NOT to be in a normal use, wherein the partial power-down mode at least comprises a power-down of the components related to the wireless link; and providing that current and previous modes of operation of the transmitting device are available.

16. A method according to claim 15, further comprising:
providing that the first, transmitting device is set in an operational state or Normal mode when the first and second devices are within a Typical range of distances from each other, the Typical zone, as detected by a transmitting device in that a link can be established between the two devices using a normal transmit power.

17. A method according to claim 16, further comprising:
providing that the first, transmitting device can detect whether it is located in a VeryClose zone, where the two devices are closer to each other than in the Typical zone and in which case the transmitting device is set in a VeryClose mode and/or providing that the first, transmitting device can detect whether it is located in a VeryFar zone, where the two devices are farther away from each other than in the Typical zone and in which case the transmitting device is set in a VeryFar mode.

18. A method according to claim 15, further comprising:
providing a wake-up algorithm adapted to identify at predefined points in time whether or not a current partial power-down mode should continue.

19. A method according to claim 18 wherein the current partial power-down mode is continued—in case the previous mode was a VeryClose mode—if a link to the other device can be established with an extremely low transmit power level, or if this is not the case and if a link can NOT be established at a normal transmit power level, or—in case the previous mode was a VeryFar mode—if a link to the other device can neither be established with an extremely low transmit power level, nor with a maximum normal power level.

20. A method according to claim 19, further comprising:
providing that the transmitting device is otherwise set in a normal mode if a link to the other device can be established at a normal transmit power level.

21. A data processing system, comprising a processor and program code means for causing the processor to perform the method of claim 15.

22. A tangible computer-readable medium storing a computer program comprising program code means for causing a data processing system to perform the method of claim 15, when said computer program is executed on the data processing system.

23. A communication system, comprising:
a first and a second communication device, each comprising
 a transmit unit and a receive unit for establishing a wireless link between the communication devices,
wherein at least the first communication device is a portable listening device and comprises a control unit configured to dynamically adjust the transmit power of its transmit unit based on a measure of quality of the wireless link between the communication devices,
the communication system is configured to use the dynamic transmit power adjusting to implement a partial power-down mode of the system, when the two communication devices are expected not to be in a normal use,
the partial power-down mode comprises at least a power-down of components related to the wireless link,
the communication system is configured to be in an operational state or Normal mode when the first and second devices are within a Typical range of distances from each other, the Typical zone, and
the communication system is further configured to detect whether a transmitting device is located in a VeryClose zone, where the two devices are closer to each other than in the Typical zone and in which case the system is in a VeryClose mode.

\* \* \* \* \*